United States Patent
Song

(10) Patent No.: US 7,602,662 B2
(45) Date of Patent: Oct. 13, 2009

(54) ROW ADDRESS CONTROL CIRCUIT IN SEMICONDUCTOR INTEGRATED CIRCUIT AND METHOD OF CONTROLLING ROW ADDRESS USING THE SAME

(75) Inventor: Ho-Uk Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 134 days.

(21) Appl. No.: 11/646,469

(22) Filed: Dec. 28, 2006

(65) Prior Publication Data
US 2007/0263467 A1    Nov. 15, 2007

(30) Foreign Application Priority Data
May 9, 2006    (KR) ...................... 10-2006-0041618

(51) Int. Cl.
*G11C 7/00* (2006.01)
(52) U.S. Cl. ............. 365/222; 365/230.06; 365/189.09; 365/230.03
(58) Field of Classification Search .................. 365/222, 365/230.06, 189.09, 230.03
See application file for complete search history.

(56) References Cited
U.S. PATENT DOCUMENTS

| | | | |
|---|---|---|---|
| 5,781,494 A * | 7/1998 | Bae et al. ............... | 365/230.03 |
| 5,844,857 A | 12/1998 | Son et al. | |
| 7,145,820 B2 * | 12/2006 | Kwack et al. ............... | 365/203 |
| 7,212,465 B2 * | 5/2007 | Kang ......................... | 365/193 |
| 2002/0163845 A1 * | 11/2002 | Ooishi et al. ............... | 365/222 |
| 2003/0081490 A1 * | 5/2003 | Nagasawa et al. ....... | 365/230.03 |
| 2004/0013024 A1 * | 1/2004 | Park .......................... | 365/226 |
| 2005/0141255 A1 | 6/2005 | Ko et al. | |
| 2006/0133168 A1 * | 6/2006 | Kwack et al. ............... | 365/203 |

FOREIGN PATENT DOCUMENTS

| | | |
|---|---|---|
| JP | 10-208474 A | 8/1998 |
| KR | 1020040053911 | 6/2004 |
| KR | 1020050011923 | 1/2005 |
| KR | 1020070009822 | 1/2007 |

\* cited by examiner

*Primary Examiner*—Thong Q Le
(74) *Attorney, Agent, or Firm*—Venable LLP; Jeffri A. Kaminski

(57) ABSTRACT

Disclosed are a row addresses control circuit of a semiconductor integrated circuit and method of controlling row addresses using the same. The circuit includes: a pulse generator receiving a bank active signal to generate a bank active pulse signal; a refresh mode input circuit combining the bank active pulse signal with a refresh signal to generate a refresh combination signal; and a plurality of row address control units driving and latching each global row enable signal to convert the global row enable signal to a local row enable signal in response to an input of the refresh combination signal.

20 Claims, 3 Drawing Sheets

ROW ADDRESS CONTROL CIRCUIT IN SEMICONDUCTOR INTEGRATED CIRCUIT AND METHOD OF CONTROLLING ROW ADDRESS USING THE SAME

FIELD OF THE INVENTION

1. Technical Field

The present invention relates to a semiconductor memory, and more particularly, to a row address control circuit in a semiconductor integrated circuit and method of controlling the row address using the same.

2. Related Art

Conventional semiconductor integrated circuits selectively activate one memory bank of a plurality of memory banks to carry out data input and output operations in a normal operation mode. The data input or output operation is initiated by activating the corresponding memory bank with an enabled bank active signal allocated to each memory bank. In this case, global row enable signals generated by decoding row addresses are converted to local row enable signals when the bank active signal is enabled, thereby selectively activating respective word lines within the bank.

A plurality of memory banks of the conventional semiconductor integrated circuit are simultaneously activated in a refresh operation mode. Accordingly, the data input or output operation is simultaneously carried out on the plurality of memory banks. In this case, the memory banks operate regardless of whether the bank active signal is enabled, and word lines of each bank are sequentially activated by a refresh counter to carry out the refresh operation.

A conventional row address control circuit, which receives the bank active signal and the global row enable signal and sends local row enable signals to the corresponding memory banks, continuously generates the local row enable signals which are not used in the refresh mode, thereby causing much current to be consumed.

Referring to FIG. 1, the row address control circuit includes a pulse generator 10 and n row address control units 20.

The pulse generator 10 receives a bank active signal ba to generate a bank active pulse signal bap.

Each of the row address control units 20 drives and latches a global row enable signal gxe<i> in response to an input of the bank active pulse signal bap. Thus the global row enable signal gxe<i> is converted to a local row enable signal lxe<i>.

One row address control circuit having the above-described configuration is provided per memory bank, and one bank active signal ba is allocated per row address control circuit to-operate the row address control circuit when the enabled bank active signal ba is connected. In addition, the global row enable signal gxe<i> is a signal generated by decoding the row address in an address decoder, and is simultaneously sent to a plurality of row address control circuits.

In this case, the bank active signal ba is a High Enable signal, and the bank active pulse signal bap is a Low Enable signal having a shorter enable time than the bank active signal ba.

When the bank active signal ba is enabled; enabling the bank active pulse signal bap, the n row address control units 20 drive the corresponding global row enable signals gxe<i> to output them as respective local row enable signals lxe<i>. The row address control units 20 then latch the global row enable signals gxe<i> which are already input to continuously output the local row enable signals lxe<i> even when the bank active pulse signal bap is disabled. The local row enable signals lxe<i> are continuously output until the bank active pulse signal bap is enabled again.

When the semiconductor integrated circuit enters a refresh mode, operations of a plurality of memory banks are not influenced by the local row enable signals lxe<1:n>, and are carried out on respective circuit regions prepared for the refresh mode. The semiconductor integrated circuit activates the plurality of memory banks regardless of whether the bank active signal ba is enabled, and activates word lines regardless of whether the local row enable signals lxe<1:n> are enabled.

The row address control circuit continuously carries out the above-described operations. Accordingly, an electric potential of high level is formed in a first node N1 of FIG. 1 while the bank active pulse signal bap is disabled. This is not a negligible level of power loss considering that the bank active pulse signal bap has a shorter enable time than the bank active signal ba. Further, there are the same number of row address control circuits as memory banks, so the level of power loss occurring on the semiconductor integrated circuit may be more severe. Such a level Of power loss has not been considered in the conventional row address control circuit of the semiconductor integrated circuit, which has in turn caused a decrease in the efficiency of utilizing the semiconductor integrated circuit.

SUMMARY OF THE INVENTION

An embodiment of the present may be a row address control circuit in a semiconductor integrated circuit which can reduce current consumption.

An embodiment of the present invention may be a method of controlling a row address circuit in a semiconductor integrated circuit which can reduce current consumption.

An embodiment of the present invention may be row address controlling circuit in a semiconductor integrated circuit, comprising: a pulse generator configured to receive a bank active signal in order to generate a bank active pulse signal; a refresh mode input circuit configured to combine the bank active pulse signal with a refresh signal in order to generate a refresh combination signal; and a plurality of row address control units configured to drive and latch each global row enable signal in order to convert the global row enable signal into a local row enable signal in response to an input of the refresh combination signal.

Another embodiment of the present invention may be a row address controlling circuit in a semiconductor integrated circuit, comprising: a refresh mode input circuit configured to generate a refresh combination signal having an electric potential of ground level regardless of whether a bank active pulse signal is enabled in a refresh mode; and a plurality of row address control units configured to drive and latch each global row enable signal in order to convert the global row enable signal into a local row enable signal in response to an input of the refresh combination signal.

Still another embodiment of the present invention may be a method of controlling row addresses, comprising: receiving a bank active signal in order to generate a bank active pulse signal; combining the bank active pulse signal with a refresh signal to generate a refresh combination signal; and driving and latching each global row enable signal in response to an input of the refresh combination signal in order to convert the global row enable signals into respective local row enable signals.

Yet another embodiment of the present invention may be a method of controlling row addresses, comprising: generating a refresh combination signal having an electric potential of ground level regardless of whether a bank active pulse signal is enabled in a refresh mode; and driving and latching each global row enable signal in response to an input of the refresh combination signal in order to convert the global row enable signals into respective local row enable signals.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION OF EXEMPLARY EMBODIMENT

Figure 1:
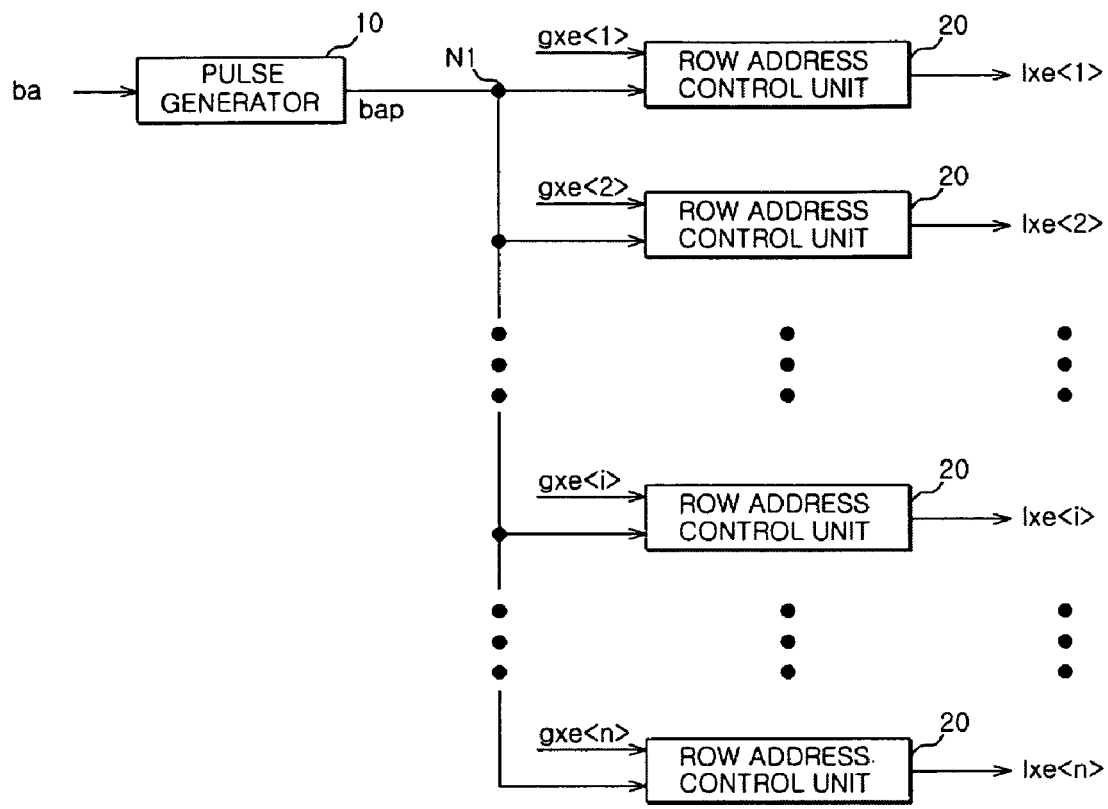
FIG. 1 is a configuration diagram of a conventional row address control circuit in a semiconductor integrated circuit.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Hereinafter, an exemplary embodiment of the present invention will be described in conjunction with the accompanying drawings.

Figure 2:
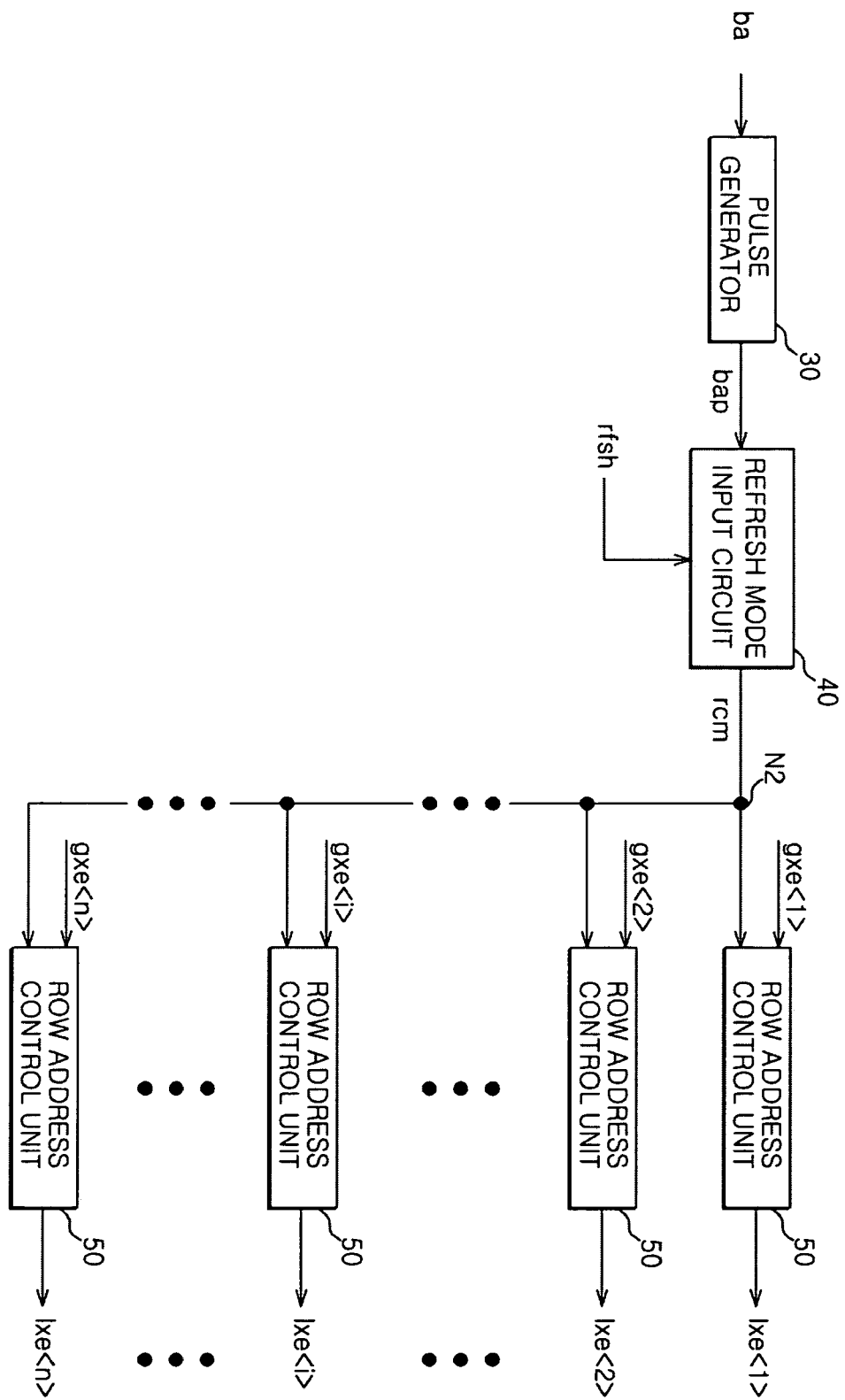
FIG. 2 is an exemplary block diagram of a row address control circuit of a semiconductor integrated circuit according to the present invention.

Referring to FIG. 2, the row address control circuit may include a pulse generator 30, a refresh mode input circuit 40, and n row address control units 50.

One row address control circuit may be provided per each memory bank, and one bank active signal ba may be allocated to each row address control circuit. When the bank active signal ba is enabled, the row address control, circuit coupled to the enabled bank active signal may operate. In addition, the global row enable signals gxe<i> may be signals generated by decoding row addresses in an address decoder, which may be simultaneously sent to a plurality of the row address control circuits.

Further, the bank active signal ba may be a high enable signal, and the bank active pulse signal bap may be an enable signal of low level with a shorter enable time than the bank active signal ba. The refresh signal rfsh may be a signal enabled to a high level when the semiconductor integrated circuit enters a refresh mode.

The refresh combination signal rcm generated in the refresh mode input circuit 40 may be a signal having the same waveform as the bank active pulse signal bap in a normal mode. The refresh signal rcm may be sunk to a ground voltage level in a refresh mode.

When the bank active signal ba is enabled in the normal mode, the bank active pulse signal may be enabled. Accordingly, when the refresh combination signal rcm is enabled, the n row address control units 50 may drive the respective global row enable signals gxe<i>, to output them as respective local row enable signals lxe<i>. The row address control units 50 may then latch the global row enable signals gxe<i> which are already input, in order to continuously output the local row enable signals lxe<i> even when the refresh combination signal rcm is disabled. The local row enable signals lxe<i> may be continuously output until the point of time that the bank active pulse signal bap is enabled again.

The refresh combination signal rcm, may have an electric potential of ground level in the refresh mode. Accordingly, the n row address control units 50 may continuously carry out the operations of driving the respective global row enable signals gxe<i> and outputting them as respective local row-enable signals lxe<i>. The n local row enable signals lxe<i> generated at the refresh mode may not carry out the operation of activating word lines of the corresponding memory bank.

The second node N2 may be sunk to the ground voltage level when the semiconductor memory integrated circuit enters the refresh mode. This may reduce power consumption. Further, the number of row address control circuits provided may be equal to the number of memory banks, which may enhance the power efficiency of the semiconductor memory integrated circuit to a greater extent.

Figure 3:
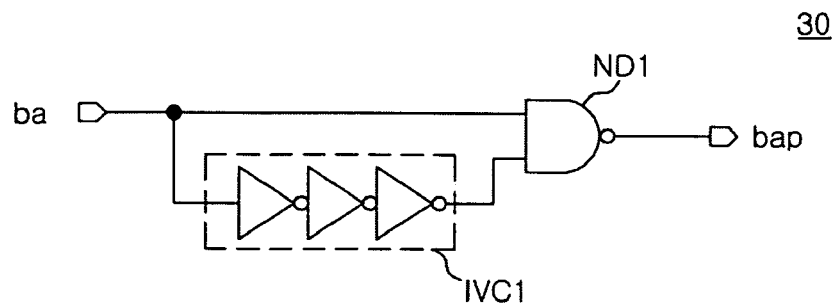
FIG. 3 is an exemplary circuit diagram showing a detailed configuration of a pulse generator of FIG. 2.

The pulse generator 30 may receive the bank active signal ba in order to generate the bank active pulse signal bap. Pulse generator 30, as shown in FIG. 3, may include a first inverter chain IVC1 which may invert and delay the bank active signal, and a first NAND gate ND1 which may receive the bank active signal ba and an output signal of the first inverter chain IVC1 in order to output the bank active pulse signal bap.

As the bank active signal ba input to the pulse generator 30 is enabled to a peripheral voltage level Vperi having high level, the bank active pulse signal bap output from the pulse generator may be enabled to a ground voltage level VSS having a low level. In this case, the bank active pulse signal bap may have a pulse of shorter width compared to the bank active signal ba, and the width of the enable interval of the bank active pulse signal bap may be determined by a delay time applied to the bank active signal ba by the first inverter chain IVC1.

Figure 4:
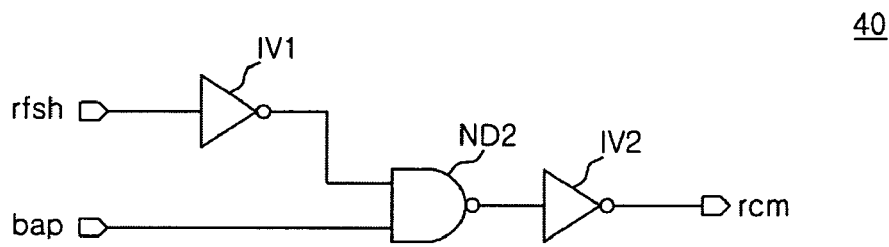
FIG. 4 is an exemplary circuit diagram showing a detailed configuration of a refresh mode input circuit of FIG. 2.

The refresh mode input circuit 40 may combine the bank active pulse signal bap with the refresh signal rfsh to generate the refresh combination signal rcm. Such a refresh mode input circuit 40, as shown in FIG. 4, may include a first inverter IV1 which may receive the refresh signal rfsh, a second NAND gate ND2 which may receive an output signal of the first inverter IV1 and the bank active pulse signal bap, and a second inverter IV2 which may receive an output signal of the second NAND gate ND2 in order to output the refresh combination signal rcm.

In accordance with the above-described configuration, the refresh combination signal rcm may have a low electric potential when the refresh signal rfsh is enabled, and may have an electric potential of the same waveform as the bank active pulse signal bap when the refresh signal rfsh is disabled. The electric potential of the refresh combination signal rcm may have an electric potential of ground level in the refresh mode, and may have the same waveform level as the bank active pulse signal bap in the normal mode.

Figure 5:
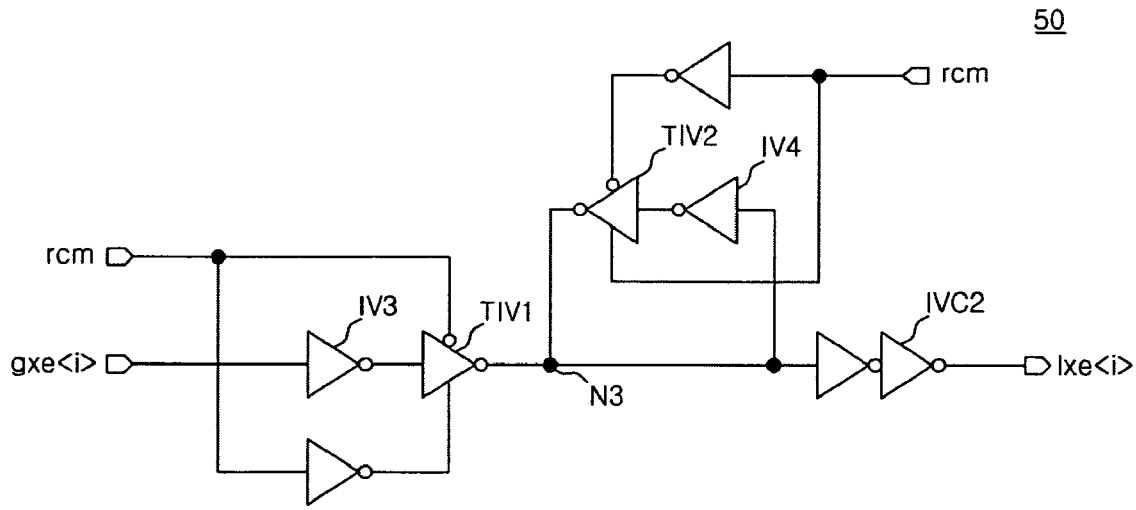
FIG. 5 is an exemplary circuit diagram showing a detailed configuration of a row address control unit of FIG. 2.

Each of the row address control units 50 may drive and latch the global row enable signal gxe<i> corresponding to an input of the bank active pulse signal bap, in order to convert the global row enable signal gxe<i> to the local row enable signal lxe<i>. The number of such a row address control unit 50 is n, however, FIG. 5 shows only one row address control unit out of the n row address control units. The n row address control units may have the same configuration as each other. Referring to FIG. 5, the row address control unit 50 may include a third inverter IV3 and a first three-stage inverter TIV1 which may non-invert the corresponding global row enable signal gxe<i> to be output to a third node N3 when the electric potential of the refresh combination signal rcm has a low level. The row address control unit 50 may include a fourth inverter IV4 and a second three-stage inverter TIV2 which may latch the signal applied to the third node N3 when the electric potential of the refresh combination signal rcm has a high level. The row address control unit 50 may include a second inverter chain IVC2 which may non-invert the signal applied to the third node N3 to output it as the corresponding local row enable signal lxe<i>.

In the normal mode of the semiconductor memory integrated circuit, the refresh combination signal rcm may have the same waveform as the bank active pulse signal bap. This may cause the bank active signal ba to be enabled, so that the refresh combination signal has an electric potential of low level. The first three-stage inverter TIV1 may be turned on, so that the global row enable signal gxe<i> may be non-inversely driven by the third inverter IV3 and the first three-stage inverter TIV1, and may be sent to the third node N3. In this case, the second three-stage inverter TIV2 may be turned off so that the latch operation is not carried out. The signal applied to the third node N3 may then be non-inversely driven by the second inverter chain IVC2 again, so that it is output as the local row enable signal lxe<i>.

When the refresh combination signal rcm transitions to a high level again, the first three-stage inverter TIV1 may be turned off and the global row enable signal gxe<i> may not input thereto. However, the second three-stage inverter TIV2 may be turned on, so that the latch operation on the signal already applied to the third node N3 by the fourth inverter IV4 and the second three-stage inverter TIV2 is carried out. The signal of the third node N3 may then be non-inversely driven by the second inverter chain IVC2 to be output as the local row enable signal lxe<i>.

In the refresh mode of the semiconductor memory integrated circuit, the electric potential of the refresh combination signal rcm may have a low level. Accordingly, outputting of the incoming global row enable signal gxe<i> as the local row enable signal lxe<i> through the third inverter IV3, the first three-stage inverter TIV1 and the second inverter chain IVC2, may be continuously carried out, and the latch operation may be not carried out. However, the local row enable signal lxe<i> generated in the refresh mode may not be used for activating the corresponding word line within the memory bank.

The row address control circuit of the semiconductor integrated circuits may combine the bank active signal ba with the refresh signal rfsh to generate the refresh combination signal rcm, which may control the n row address control units 50 so that power consumption may be reduced in the refresh mode. Reduced power consumption may result from sinking the electric potential of the refresh combination signal rcm applied to the second node N2 of FIG. 2 to a ground voltage level. The row address control circuit of the semiconductor integrated circuit may carry out the same operation as the conventional art in the normal mode, and may prevent unnecessary current from flowing in the refresh mode which may reduce power consumption in a semiconductor integrated circuit. Further, the number of row address control circuits provided may be equal to the number of memory banks, which may enhance the power efficiency of the semiconductor memory integrated circuit to a greater extent.

As described above, the row address control circuit may control an electric potential of a signal that may be the combination of the bank active signal and the refresh signal, so that the electrical potential of the combination signal may be at the ground level when the semiconductor memory integrated circuit enters a refresh mode. Accordingly, if the semiconductor memory integrated circuit is operated in the refresh mode, current consumption may be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A row address control circuit for a semiconductor integrated circuit, comprising:
   a pulse generator configured to receive a bank active signal and generate a bank active pulse signal;
   a refresh mode input circuit configured to combine the bank active pulse signal with a refresh signal and generate a refresh combination signal being sunk to a ground voltage level throughout a refresh mode; and
   a plurality of row address control units configured to drive and latch each global row enable signal, receive the refresh combination signal, and convert the global row enable signal into a local row enable signal in response to the refresh combination signal.

2. The row address control circuit for a semiconductor integrated circuit of claim 1, wherein the bank active pulse signal is enabled to a low level with a shorter enable time than the bank active signal.

3. The row address control circuit for a semiconductor integrated circuit of claim 1, wherein the refresh combination signal has a same waveform as the bank active pulse signal in a normal mode.

4. The row address control circuit for a semiconductor integrated circuit of claim 1, wherein the global row enable signal is generated by decoding a row address in an address decoder, and the local row enable signal is a signal for activating a word line of each bank.

5. The row address control circuit for a semiconductor integrated circuit of claim 1, wherein the refresh mode input circuit comprises:
   a first inverter configured to receive the refresh signal and to produce an output signal;
   a NAND gate configured to receive the output signal of the first inverter and the bank active pulse signal and to produce an output signal; and
   a second inverter configured to receive the output signal of the NAND gate and output the refresh combination signal.

6. The row address control circuit for a semiconductor integrated circuit of claim 1, wherein the row address control unit comprises:
   a first inverter coupled to a first three-stage inverter configured to non-inversely drive a corresponding global row enable signal and output the global row enable signal to a first node when the electric potential of the refresh combination signal is at a low level;
   a second inverter coupled to a second three-stage inverter configured to latch the signal applied to the first node when the electric potential of the refresh combination signal is at a high level; and an inverter chain configured to non-invert the signal applied to the first node and output the signal as the corresponding local row enable signal.

7. A row addresses control circuit for a semiconductor integrated circuit, comprising:

a refresh mode input circuit configured to generate a refresh combination signal having an electric potential of ground level regardless of whether a bank active pulse signal generated from a bank active signal is enabled in a refresh mode decided by a refresh signal; and a plurality of row address control units configured to drive and latch each global row enable signal and convert the global row enable signal to a local row enable signal in response to an input of the refresh combination signal.

8. The row address control circuit for a semiconductor integrated circuit of claim 7, wherein the bank active pulse signal is generated from a bank active signal, and enabled to a low level with a shorter enable time than the bank active signal.

9. The row address control circuit for a semiconductor integrated circuit of claim 7, wherein the refresh combination signal has a same waveform as the bank active pulse signal in a normal mode.

10. The row address control circuit for a semiconductor integrated circuit of claim 7, wherein the global row enable signal is a signal generated by decoding a row address in an address decoder, and the local row enable signal is a signal for activating a word line of each bank.

11. The row address control circuit for a semiconductor integrated circuit of claim 7, wherein the refresh mode input circuit comprises:

a first inverter configured to receive the refresh signal and to produce an output signal;

a NAND gate configured to receive an output signal of the first inverter and the bank active pulse signal and to produce an output signal; and a second inverter configured to receive an output signal of the NAND gate and output the refresh combination signal.

12. The row address control circuit for a semiconductor integrated circuit of claim 7, wherein the row address control unit comprises:

a first inverter coupled to a first three-stage inverter configured to non-inversely drive a corresponding global row enable signal and output the global row enable signal to a first node when the electric potential of the refresh combination signal is at a low level;

a second inverter coupled to a second three-stage inverter configured to latch the signal applied to the first node when the electric potential of the refresh combination signal is at a high level; and an inverter chain configured to non-inversely drive the signal applied to the first node and output the signal as the corresponding local row enable signal.

13. A method of controlling row addresses, comprising:

receiving a bank active signal and generating a bank active pulse signal;

combining the bank active pulse signal with a refresh signal and generating a refresh combination signal being sunk to a ground level throughout a refresh mode; and driving and latching each global row enable signal in response to an input of the refresh combination signal and converting the global row enable signals into respective local row enable signals.

14. The method of controlling row addresses of claim 13, wherein the bank active pulse signal is enabled to a low level with a shorter enable time than the bank active signal.

15. The method of controlling row addresses of claim 13, wherein the refresh combination signal has a same waveform as the bank active pulse signal in a normal mode.

16. The method of controlling row addresses of claim 13, wherein the global row enable signal, is a signal generated by decoding a row address in an address decoder, and the local row enable signal is a signal for activating a word line of each bank.

17. A method of controlling row addresses, comprising:

generating a refresh combination signal having an electric potential of ground level regardless of whether a bank active pulse signal generated from a bank active signal is enabled in a refresh mode decided by a refresh signal; and driving and latching each global row enable signal in response to an input of the refresh combination signal and converting the global row enable signals into respective local row enable signals.

18. The method of controlling row addresses of claim 17, wherein the bank active pulse signal is generated from a bank active signal, and enabled to a low level with a shorter enable time than the bank active signal.

19. The method of controlling row addresses of claim 17, wherein the refresh combination signal has a same waveform as the bank active pulse signal in a normal mode.

20. The method of controlling row addresses of claim 17, wherein the global row enable signal is a signal generated by decoding a row address in an address decoder, and the local row enable signal is a signal for activating a word line of each bank.

* * * * *